US009964366B2

(12) United States Patent
Koizuka et al.

(10) Patent No.: US 9,964,366 B2
(45) Date of Patent: May 8, 2018

(54) HEAT-RADIATING SYSTEM

(71) Applicant: NISSAN MOTOR CO., LTD., Yokohama-shi, Kanagawa (JP)

(72) Inventors: Yousuke Koizuka, Kanagawa (JP); Tatsuomi Nakayama, Kanagawa (JP)

(73) Assignee: NISSAN MOTOR CO., LTD., Yokohama-shi (JP)

(*) Notice: Subject to any disclaimer, the term of this patent is extended or adjusted under 35 U.S.C. 154(b) by 0 days. days.

(21) Appl. No.: 15/026,055

(22) PCT Filed: Oct. 2, 2013

(86) PCT No.: PCT/JP2013/076825
§ 371 (c)(1),
(2) Date: Mar. 30, 2016

(87) PCT Pub. No.: WO2015/049737
PCT Pub. Date: Apr. 9, 2015

(65) Prior Publication Data
US 2016/0231069 A1    Aug. 11, 2016

(51) Int. Cl.
*F28F 13/12*    (2006.01)
*H01L 23/473*    (2006.01)
(Continued)

(52) U.S. Cl.
CPC .............. *F28F 13/12* (2013.01); *F15D 1/009* (2013.01); *F28D 15/00* (2013.01); *H01L 23/473* (2013.01); *H01L 2924/0002* (2013.01)

(58) Field of Classification Search
CPC .......... F28F 13/12; F15D 1/009; F28D 15/00; H01L 23/473; H01L 2924/0002; H05K 7/20254; H05K 7/20263
(Continued)

(56) References Cited

U.S. PATENT DOCUMENTS 5,237,200 A * 8/1993 Nanba ............... H01L 21/28525
257/565
5,978,220 A * 11/1999 Frey ..................... H01L 23/473
165/80.4
(Continued)

FOREIGN PATENT DOCUMENTS

EP    2 838 329 A1    2/2015
JP    2003-8264 A    1/2003
(Continued)

*Primary Examiner* — Raheena R Malik
(74) *Attorney, Agent, or Firm* — Foley & Lardner LLP

(57) ABSTRACT

The heat-radiating system which radiates heat by heat exchange between a substrate 22 and cooling fluid. The heat-radiating system has a cooling structure that includes a vortex flow generating portion C1 on the surface of the substrate 22 in contact with the cooling fluid. The vortex flow generating portion C1 is composed of a plurality of recesses 22b that extend in the direction β intersecting the flow direction of the cooling fluid and causes a vortex flow depending on the flow condition of the cooling fluid. The recess depth H of the vortex flow generating portion and the laminar sub-layer thickness $\delta_b$ near the wall surface satisfy the relation of $H > \delta_b = 63.5/(Re^{7/8}) \times d$ (where Re is the Reynolds number, d is the characteristic length, and the Reynolds number is $Re = ud/v$ where v is the kinematic viscosity of the cooling fluid, u is the flow velocity of the cooling fluid and d is the characteristic length), and operation of the heat radiating system is controlled such that the flow conditions of the cooling fluid fall within the range in which the relation of $u/v \leq 206 \times d^{1/7}$ (where u, v and d are as defined above) satisfied.

8 Claims, 8 Drawing Sheets

(51) Int. Cl.
  *F15D 1/00* (2006.01)
  *F28D 15/00* (2006.01)

(58) Field of Classification Search
  USPC .................................................. 165/109.1
  See application file for complete search history.

(56) References Cited

U.S. PATENT DOCUMENTS

| | | | | |
|---|---|---|---|---|
| 6,351,384 | B1* | 2/2002 | Daikoku | F28F 3/02 |
| | | | | 165/80.3 |
| 6,867,973 | B2* | 3/2005 | Chang | F28F 13/12 |
| | | | | 165/109.1 |
| 7,190,580 | B2* | 3/2007 | Bezama | F28F 3/12 |
| | | | | 165/80.4 |
| 7,578,337 | B2* | 8/2009 | Spokoiny | H05K 7/20254 |
| | | | | 165/109.1 |
| 8,061,412 | B2* | 11/2011 | Ippoushi | H01L 23/473 |
| | | | | 165/185 |
| 9,243,855 | B2* | 1/2016 | Koizuka | H01L 23/473 |
| 2004/0184237 | A1* | 9/2004 | Chang | F28F 13/12 |
| | | | | 361/699 |
| 2007/0062674 | A1 | 3/2007 | Ippoushi et al. | |
| 2007/0153480 | A1 | 7/2007 | Zhang et al. | |
| 2010/0090336 | A1* | 4/2010 | Yoshida | H01L 23/473 |
| | | | | 257/717 |
| 2011/0180236 | A1* | 7/2011 | Krasnov | F28F 9/0263 |
| | | | | 165/104.19 |
| 2011/0240267 | A1* | 10/2011 | Blanc | A47J 31/542 |
| | | | | 165/109.1 |
| 2012/0097382 | A1* | 4/2012 | Chen | F28F 19/00 |
| | | | | 165/185 |
| 2012/0175094 | A1* | 7/2012 | Rice | F28D 1/03 |
| | | | | 165/170 |
| 2015/0168084 | A1* | 6/2015 | Koizuka | H01L 23/473 |
| | | | | 165/109.1 |
| 2016/0231069 | A1* | 8/2016 | Koizuka | H01L 23/473 |

FOREIGN PATENT DOCUMENTS

| | | |
|---|---|---|
| JP | 2008-091700 A | 4/2008 |
| JP | 2009-520178 A | 5/2009 |
| JP | 2012-064732 A | 3/2012 |
| JP | 2012-109495 A | 6/2012 |

* cited by examiner

HEAT-RADIATING SYSTEM

TECHNICAL FIELD

The present invention relates to a heat-radiating system that is used for cooling a heat generating body such as a semiconductor and a motor. In more detail, the present invention relates to a high-efficiency heat-radiating system that uses a cooling structure performing heat exchange between solid and fluid in a flow condition suitable for promoting heat transfer.

BACKGROUND ART

A prior art of this kind is disclosed in Patent Document 1 titled "cooling apparatus".

The cooling apparatus disclosed in Patent Document 1 includes a plurality of heat-radiating members that extend in the direction away from an electronic component and cools the electronic component when cooling fluid flows between the plurality of heat-radiating members. The plurality of heat-radiating members have a shorter length as the heat conducting temperature due to the heat generated by the electronic component is lower.

Further, the cooling apparatus is designed such that the length of the plurality of heat-radiating members becomes shorter from the center toward the ends of the electronic component, along the flow direction of the cooling fluid.

CITATION LIST

Patent Document

Patent Document 1: JP 2003-8264A

SUMMARY OF INVENTION

Technical Problem

However, it is difficult to reduce the size of such conventional cooling apparatuses since a plurality of heat-radiating members extend in the direction away from an electronic component, and this increases the contact area between the heat radiating members and cooling fluid so as to cool the electronic component.

The present invention was made in view of the above-described problem with the prior art, and an object thereof is to provide a heat-radiating system that has a reduced apparatus size and a reduced pressure loss of cooling fluid and that can also perform efficient heat radiation due to the promoted heat transfer.

Solution to Problem

As a result of the inventors' keen study for achieving the above-described object, they found that the above-described object can be achieved by employing a cooling structure that includes a vortex flow generating portion composed of predetermined recesses and using the cooling structure in a certain flow condition of cooling fluid. The present invention was thus complete.

That is, the heat radiating system of the present invention, which radiates heat by heat exchange between a substrate and cooling fluid, includes:

a cooling structure comprising a vortex flow generating portion on a surface of the substrate that is in contact with the cooling fluid, the vortex flow generating portion comprising a plurality of recesses that extend in a direction intersecting the flow direction of the cooling fluid and cause a vortex flow depending on a flow condition of the cooling fluid.

Further, a recess depth H of the vortex flow generating portion and a laminar sub-layer thickness $\delta_b$ near a wall surface satisfy the following relation (1):

$$H > \delta_b = 63.5/(Re^{7/8}) \times d \tag{1}$$

where Re is a Reynolds number, d is a characteristic length (m), and the Reynolds number is defined as Re=ud/v where v is a kinematic viscosity ($m^2/s$) of the cooling fluid, u is a flow velocity (m/s) of the cooling fluid and d is the characteristic length, and operation of the heat-radiating system is controlled such that the flow condition of the cooling fluid is within a range in which the following relation (2) is satisfied:

$$u/v \leq 206 \times d^{1/7} \tag{2}$$

where u, v and d are as defined above.

Advantageous Effects of Invention

In the present invention, the cooling structure including the vortex flow generating portion composed of the predetermined recesses is applied in the certain flow condition of the cooling fluid. Therefore, the heat-radiating system is provided which has a reduced apparatus size and a reduced pressure loss of the cooling fluid and which can also perform efficient heat radiation due to the promoted heat transfer.

DESCRIPTION OF EMBODIMENTS

Figure 1:
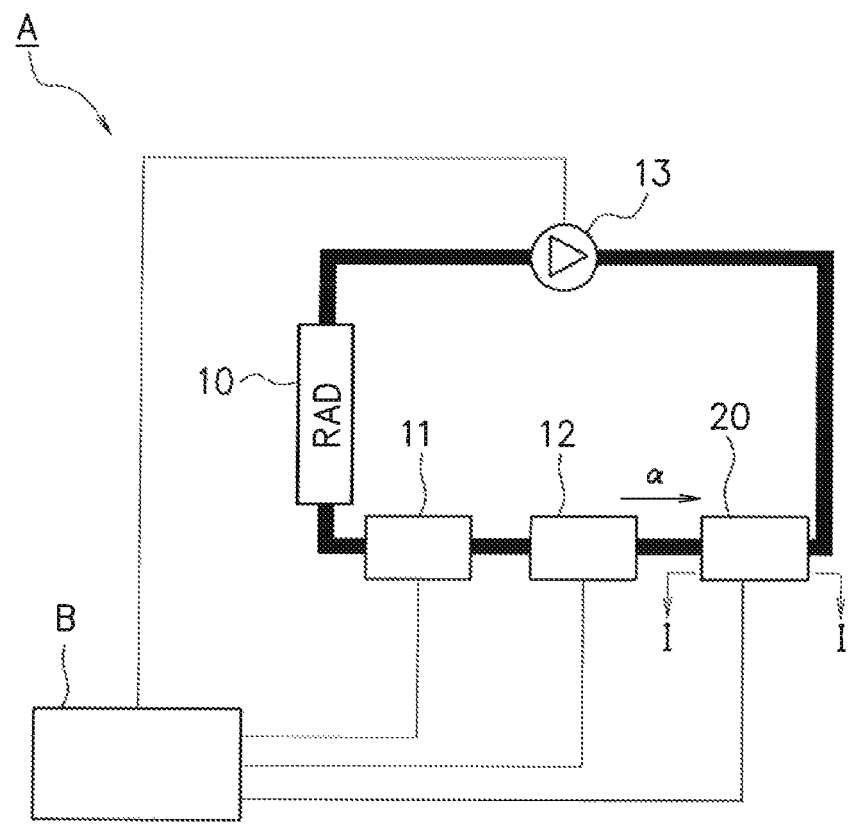
FIG. 1 is a system configuration view of a heat-radiating system according to an embodiment of the present invention.

Hereinafter, embodiments of the present invention will be described referring to the drawings.

Figure 2A:
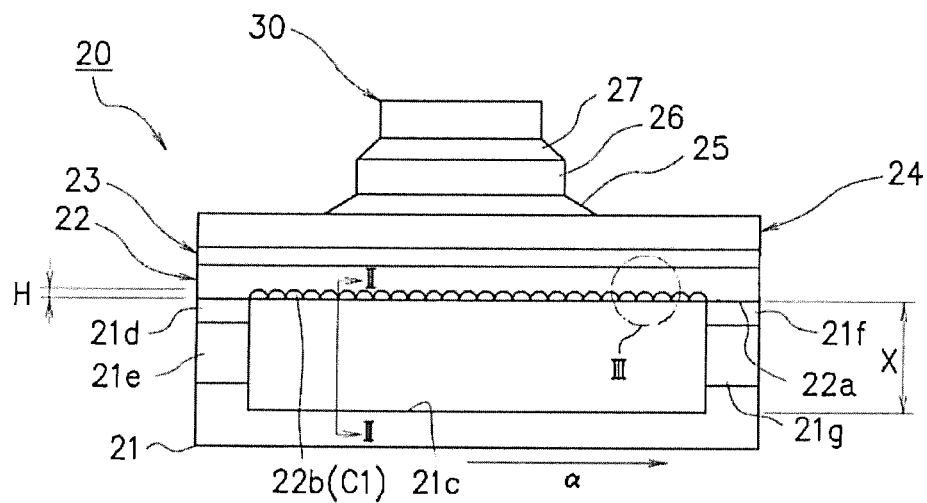
FIG. 2A is a cross-sectional view taken along the line I-I in FIG. 1, illustrating the configuration of an inverter, a part of the heat-radiating system.
Figure 2B:
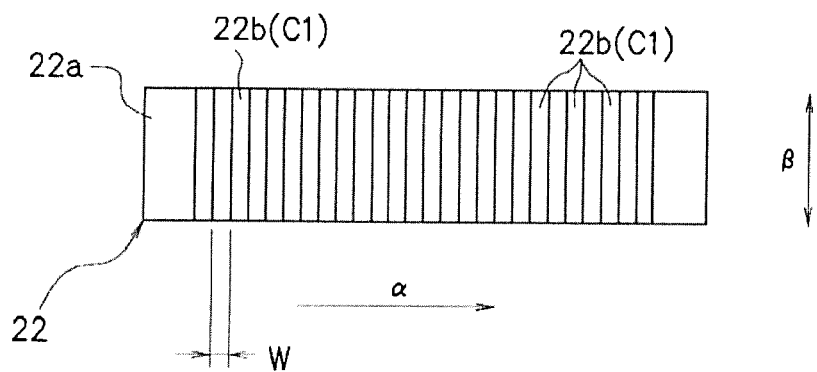
FIG. 2B is a plan view illustrating a contact surface of a cooling body with cooling fluid.
Figure 3:
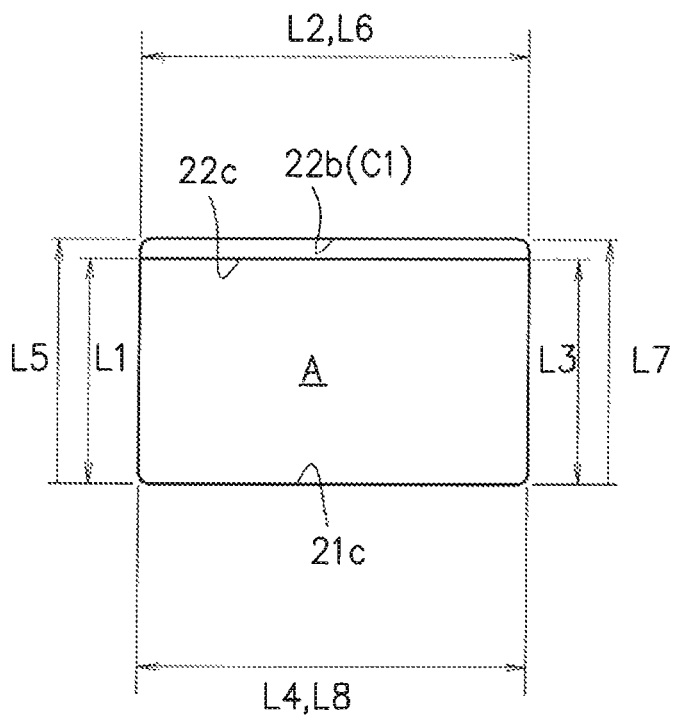
FIG. 3 is a cross-sectional view taken. along the line II-II in FIG. 2A.

FIG. 1 is a system configuration view of a heat-radiating system according to an embodiment of the present invention, FIG. 2A is a cross-sectional view taken along the line I-I in FIG. 1 illustrating the configuration of an inverter that is a part of the heat-radiating system, and FIG. 2B is a plan view of a contact surface of a cooling body with cooling fluid. FIG. 3 is a cross-sectional view taken along the line II-II in FIG. 2A.

A cooling system A according to an embodiment of the present invention includes, as illustrated in FIG. 1, a radiator 10, a water-cooled motor 11, a DC-DC converter 12, an inverter 20, an electric pump 13 and a controller B.

The water-cooled motor 11, the DC-DC converter 12, the inverter 20 and the electric pump 13 are connected to an output section of the controller B and are controlled suitably.

The controller B is composed of a CPU (central processing unit), an interface circuit and the like. The controller B performs a desired function by executing a required program.

The inverter 20 is constituted by a power converter that electrically generates an alternating current from a direct current. In this embodiment, a water jacket 21, a cooling body 22 which is an example of a substrate, an electrically insulating material 23, a bus bar 24 made of copper or the like, a solder layer 25, a heat buffering plate 26 made of copper, molybdenum or the like, a solder layer 27, and a semiconductor chip 30 which is a heat generating body are sequentially laminated as illustrated in FIG. 2A.

In a cooling fluid inflow wall 21d of the water jacket 21, an inflow opening 21e is formed for an inflow of the cooling fluid. In a cooling fluid outflow wall 21f, an outflow opening 21g is formed for an outflow of the cooling fluid.

In the water jacket 21, the cooling fluid flows in the direction indicated by the reference sign "α" in FIG. 1, FIG. 2A and FIG. 2B through the inflow opening 21e and the outflow opening 21g.

In this embodiment, the cooling body 22 is formed in a plate and has a cooling structure on a surface facing the water jacket 21, i.e. on the contact surface 22a with the cooling fluid (fluid contacting surface), which is described below.

The cooling structure has a function of cooling the semiconductor chip 30, i.e. a heat generating body, which is achieved by bringing the cooling body 22, on which the semiconductor chip 30 is mounted, into contact with (a flow of) the cooling fluid so as to cause heat exchange. The cooling structure has a vortex flow generating portion C1 that extends in the direction β intersecting the flow direction α of the cooling fluid and generates a vortex flow depending on the flow velocity of the cooling fluid.

In this embodiment, the semiconductor chip 30 which is a heat generating body, is mounted on the cooling body 22 which is a substrate, via the insulating material 23, the bus bar 24, the solder layer 25, the buffering plate 26 and the solder plate 27. The heat buffering plate 26 buffers the difference in linear expansion coefficient from is the semiconductor chip 30.

The vortex flow generating portion C1, which extends in the direction intersecting the flow direction a of the cooling fluid, has a function of generating a vortex flow depending on the flow velocity of the cooling fluid.

In this embodiment, grooves 22h having a semicircular cross-sectional shape are continuously formed in the fluid contacting surface 22a (see FIGS. 2A and 2B) of the cooling body 22 at predetermined intervals, which serves as a plurality of recesses. In this embodiment, the predetermined intervals means that adjacent two grooves 22b, 22b are formed such that the inner walls defining them intersect each other. Further, the following conditions are satisfied.

The term "to form recesses continuously" encompasses not only an arrangement in which the inner walls of adjacent recesses intersect with each other but also a manner in which the inner walls of adjacent recesses do not intersect ach other.

When the inner walls of the recesses do not intersect each other, it is preferred that the ends of the inner walls of adjacent recesses smoothly continue to each other to form a curved surface. Such ends of the inner walls that smoothly continue to form a curved surface can be readily formed by machining.

When the recesses are constituted by grooves having a semicircular cross-sectional shape, the term "inner walls intersect each other" encompasses a manner in which the inner walls come in contact with each other on the flow contacting plane, e.g. when the grooves are arranged at regular intervals that are equal to the diameter of the grooves, and also encompasses a manner in Which the grooves are arranged at intervals that are not greater than the diameter. In the latter case, the inner walls of adjacent grooves intersect on or below the flow contacting plane.

Instead of the above-described semicircular cross-sectional shape, the cross-section of the recesses may have an irregular shape, or even a combination of them.

That is, the recesses may have any shape that can generate a vortex flow depending on the flow velocity of the cooling fluid.

The term "predetermined intervals" encompasses both of regular intervals and irregular intervals in which the plurality of recesses are fully or partly arranged irregularly.

When two adjacent grooves 22b, 22b are arranged at the predetermined intervals such that the inner walls defining them intersect each other, it is possible to form a greater number of grooves 22b and thereby to generate a greater number of vortex flows.

In this embodiment, the grooves (recesses) 22b satisfy or preferably satisfy the following conditions.

(1) The maximum depth H (see FIG. 2A) of the grooves (recesses) 22b is greater than the laminar sub-layer thickness $\delta_b = 63.5/(Re^{7/8}) \times d$ near a wall surface, which is calculated from the Reynolds number Re and the characteristic length d of the flow conditions.

That is, the maximum depth H of the recesses 22b and the laminar sub-layer thickness $\delta_b$ near a wall surface satisfy the following relation (1):

$$H > \delta_b = 63.5/(Re^{7/8}) \times d \qquad (1)$$

where Re is the Reynolds number and d is the characteristic length, and the Reynolds number is defined as Re=ud/v where v is the kinematic viscosity of the cooling fluid, u is the flow velocity of the cooling fluid, and d is the characteristic length.

Furthermore, in the heat-radiating system of this embodiment, operation of the system is controlled so that the flow conditions of the cooling fluid fall within the range in which the following relation (2) is satisfied:

$$u/v \leq 206 \times d^{1/7} \qquad (2)$$

where u, v, and d are as defined above.

Under the above-described flow conditions, the laminar sub-layer thickness $\delta_b$ is controlled to be typically equal to or less than 0.7 mm.

Further, in the heat-radiating system of the present invention, it is preferred that the flow conditions of the cooling fluid are controlled to fall within the range in which the following relation (3) is satisfied:

$$u/v \leq 455 \times d^{1/7} \qquad (3)$$

where u, v and d are as defined above.

Under the above-described flow conditions, the laminar sub-layer thickness $\delta_b$ is controlled to be typically equal to or less than 0.4 mm.

(2) The value $W^+=Wu_\tau/v$ fall within the range of from 25 to 300, which is a nondimensionalized value of the opening width W (m) of the grooves 22b obtained by using the shear velocity $u_\tau=(\tau_{107}/\rho)^{1/2}$ calculated from the shearing stress $\tau_{107}$ and the fluid density $\rho(kg/m^3)$, the empirical formula of pipe friction coefficient $Cf=\tau_{107}/(0.5 \rho u^2)=0.73 \text{ Re}^{-0.25}$ calculated from the flow velocity u of the cooling fluid, the density $\rho$ and the Reynolds number Re, and the kinematic viscosity v of the cooling fluid.

(3) The maximum depth H of the grooves 22b is small compared to the distance X from the fluid contacting surface to the opposing channel surface (bottom wall surface 21c).

(4) The characteristic length d=4 A/L is long, which is calculated from the minimum channel cross-sectional area A (m²) of the channel cross-section perpendicular to the flow direction of the cooling fluid and the maximum wetted perimeter L (m). In the equation, the minimum channel cross-sectional area A refers to the cross-sectional area defined by the contour line segments L1, L2, L3 and L4 in FIG. 3. The contour line segments L1 and L3 have the same length as the distance between the bottom wall surface 21c and the tops of the protrusions 22c. The contour line segments L2 and L4 have the same length as the grooves 22b. The "wetted perimeter L" refers to the length of the contour line of the channel cross-section defined by the contour line segments L5, L6, L7 and L8 as illustrated in FIG. 3, which is in contact with the cooling fluid. The contour line segments L5 and L7 have the same length as the distance between the bottom wall surface 21c and the bottoms of the recesses 22b. The contour line segments L6 and L8 have the same length as the recesses 22b.

(5) It is preferred that the characteristic length d=4 A/L is equal to or greater than 0.004, and it is more preferred that the characteristic length d=4 A/L is equal to or greater than 0.007.

(6) It is preferred that the value $W^+$ is within the range of from 40 to 150, which is a nondimensionalized value of the recess width of the grooves 22b in the direction β perpendicular to the flow direction α of the cooling fluid.

(7) The length of the protrusions in the flow direction a of the cooling fluid gets narrower toward the tips of the protrusions, the protrusion tips have small flat areas that are parallel to the flow direction, and the uneven shape repeats in the flow direction of the cooling fluid.

With the above-described configurations, it is possible to achieve the following advantageous effects.

The vortex flow generating portion is formed which extends in the direction intersecting the flow direction of the cooling fluid and generates a vortex flow depending on the flow velocity of the cooling fluid. Therefore, the vortex flow generated by the vortex flow generating portion agitates the cooling fluid near the heat generating body or the substrate on which the heat generating body is mounted, and the heat transfer can thereby be promoted.

The maximum depth H of the grooves 22b (recesses) is greater than the laminar sub-layer thickness $\delta_b=63.5$ $(\text{Re}^{7/8})\times d$ near the wall surface, which is calculated from the Reynolds number and the characteristic length d of the flow conditions. Therefore, the heat transfer can be promoted beyond the thickness of the laminar sub-layer near the heat generating body or the substrate on which the heat generating body is mounted.

The value $W^+=Wu_\tau/v$ is within the range of from 25 to 300, which is a nondimensionalized value of the opening width W of the grooves 22b obtained by using the shear velocity $u_\tau=(\tau_\omega/\rho)^{1/2}$ calculated from the shearing stress $\tau_\omega$ and the fluid density $\rho$, the empirical formula of pipe friction coefficient $C_f=\tau_\omega/(0.5 \rho u^2)=0.73 \text{ Re}^{-0.25}$ calculated from the flow velocity u, the density $\rho$ and the Reynolds number Re, and the kinematic viscosity v. Therefore, the heat transfer efficiency can be improved.

When the characteristic length d=4 A/L is equal to or greater than 0.004, which is calculated from the minimum channel cross-sectional area A of the channel cross-section perpendicular to the flow direction of the cooling fluid and the maximum wetted perimeter L, it is possible to reduce the influence of wall shear and thus to moderate an increase in pressure loss.

When the recesses are formed as grooves that intersect the flow direction of the cooling fluid, it is possible to generate a vortex flow in the overall area of the fluid contacting surface in the direction intersecting the flow direction. Therefore, the heat transfer is promoted.

When the width of the grooves that are open to the flow of the cooling fluid is a predetermined value, it is possible to further improve the heat transfer performance. When the grooves continue in the direction perpendicular to the flow direction of the cooling fluid, it is possible to increase the occurrence frequency of vortex in the flow direction and thus to promote the heat transfer.

When the grooves are formed as recesses in the fluid contacting surface of the cooling body, it is possible to further reduce the size of the heat generating body or substrate that has the cooling structure.

Figure 4A:
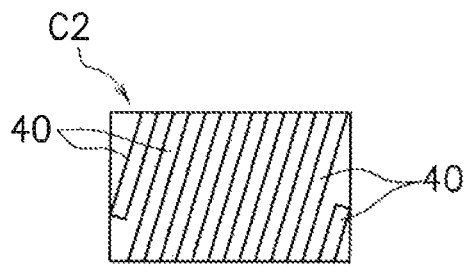
FIG. 4A is an explanatory view of a vortex flow portion according to a first variation.

Next, variations of the vortex flow generating portion will be described referring to FIGS. 4A to 4D. FIG. 4A is an explanatory view of a vortex flow generating portion according to a first variation, FIG. 4B is an explanatory view of a vortex flow generating portion according to a second variation, FIG. 4C is an explanatory view of a vortex flow generating portion according to a third variation, and FIG. 4D is an explanatory view of a vortex flow generating portion according to a fourth variation.

The vortex fib generating portion C2 of FIG. 4A according to the first variation is constituted by linear grooves 40 that are formed diagonally with respect to the flow direction α of the cooling fluid at regular intervals.

Figure 4B:
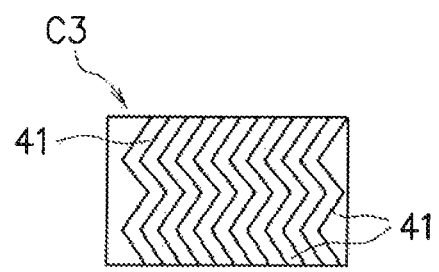
FIG. 4B is an explanatory view of a vortex flow generating portion according to a second variation.

The vortex flow generating portion C3 of FIG. 4B according to the second variation is constituted by zigzag grooves 41 that are formed perpendicular to the flow direction α of the cooling fluid at regular intervals.

Figure 4C:
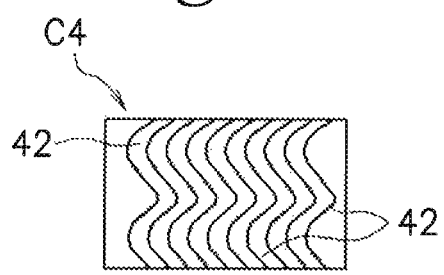
FIG. 4C is an explanatory view of a vortex flow generating portion according to a third variation.
Figure 4D:
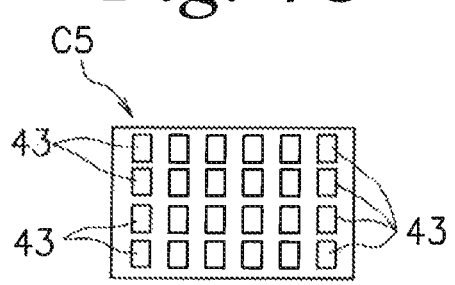
FIG. 4D is an explanatory view of a vortex flow generating portion according to a fourth variation.

The vortex flow generating portion C4 of FIG. 4C according to the third variation is constituted by wavy grooves 42 that are formed perpendicular to the flow direction α of the cooling fluid at regular intervals.

The vortex flow generating portion C5 of FIG. 4D according to the fourth variation is constituted by linear and intermittent grooves 43 that are formed perpendicular to the flow direction a of the cooling fluid at regular intervals.

EXAMPLES

Hereinafter, the present invention will be described in more detail with some examples and comparisons.

Example 1 to Example 4

For the vortex flow generating portion, grooves extending in the direction approximately perpendicular to the flow direction of the cooling fluid were employed (see FIG. 2B).

Figure 5A:
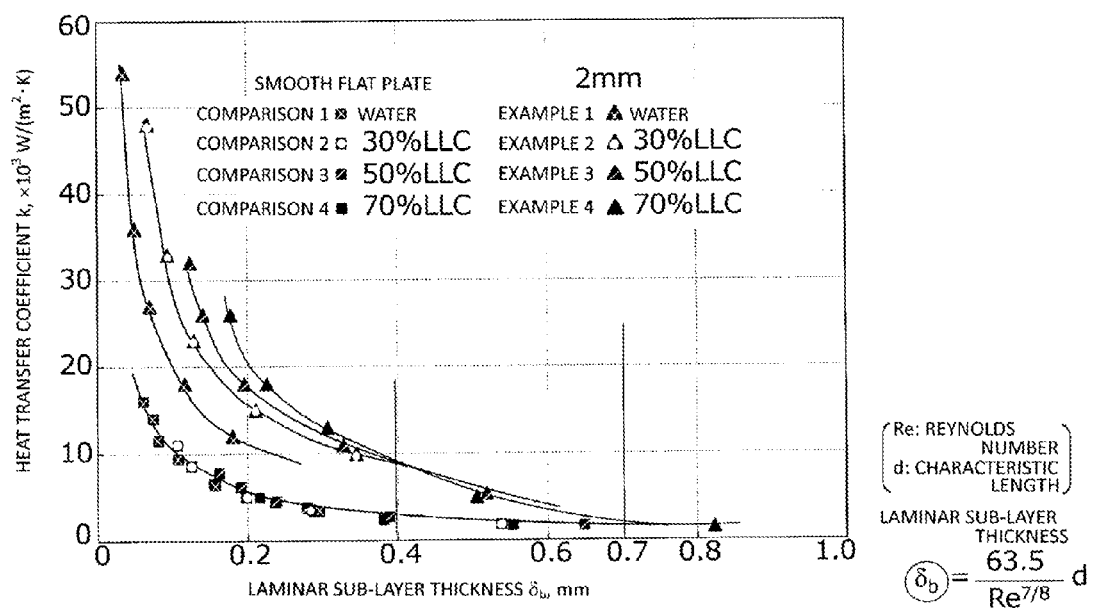
FIG. 5B is a cross-sectional view of grooves and FIG. 5A is a graph illustrating the results of measuring heat transfer coefficient.
Figure 5B:

As illustrated in FIG. 5B, the grooves had a wedge cross-sectional shape having a groove width of 0.8 mm and a recess depth H of 2 mm.

To each cooling structure with the above-described vortex flow generating portion, a heater was mounted as a heat generating body (see FIGS. 2A and 2B). Further, water (Example 1) or 30 mass % aqueous solution (Example 2), 50 mass % aqueous solution (Example 3) or 70 mass % aqueous solution (Example 4) of long-life coolant (LLC) PITWORK (genuine product of Nissan Motor Co., Ltd.) was supplied as the cooling fluid. Then, the heat transfer coefficient is measured. The experimental conditions are listed below.

Experimental Conditions

Channel width of cooling fluid: 33 (mm)
Channel height of cooling fluid: 7 (mm)
Temperature of cooling fluid: 25 (° C.)
Flow velocity of cooling fluid: 4 to 24 (L/min)
Size of heat transferring area: 33 (mm)×100 (mm)
Heater output: 100 W The results thus obtained are shown in FIG. 5A, In FIG. 5A, the laminar sub-layer $\delta_b \leq 0.7$ mm corresponds to $u/v \leq 206 \times d^{1/7}$ (where v is the kinematic viscosity of the cooling fluid, u is the flow velocity of the cooling fluid, and d is the characteristic length), and the laminar sub-layer $\delta_b \leq 0.4$ mm corresponds to $u/v \leq 455 \times d^{1/7}$ Comparison 1 to Comparison 4

The heat transfer coefficient was measured without providing any vortex flow generating portion. That is, the same processes as Example 1 to Example 4 were repeated except that a smooth flat plate with no groove was used. The results thus obtained are shown in FIG. 5A.

Example 5 to Example 8

Figure 6A:
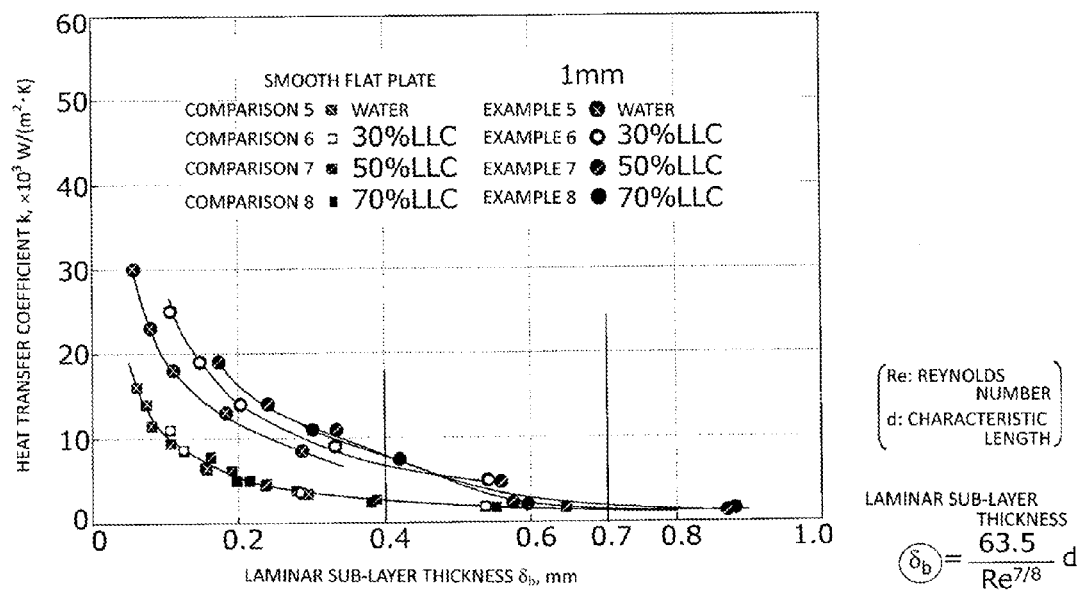
FIG. 6B is a cross-sectional view of grooves and FIG. 6A is a graph illustrating the results of measuring heat transfer coefficient.
Figure 6B:

As illustrated in FIG. 6B, a vortex flow generating portion was formed which includes grooves having a semicircular cross-sectional shape at a curvature radius of 1 mm and a recess depth of 1 mm. Except for this, the same processes as Example 1 to Example 4 were repeated. The results thus obtained are shown in FIG. 6A.

Comparison 5 to Comparison 8

The same processes as Example 5 to Example 8 were repeated except that a smooth flat plate with no groove was used. The results thus obtained are shown in FIG. 6A.

While the present invention is described with some embodiments and examples, the present invention is not limited to them. For example, the following change may be made.

In the above-described embodiments, a cooling structure is applied to an inverter, which is described as an example of the cooling structure in which the cooling fluid flows through the substrate on which the heat generating body is mounted, so as to cool the heat generating body. However, it should be understood that the cooling structure may be directly applied to a motor or the like which is a heat generating body.

REFERENCE SIGNS LIST

22 Substrate (Cooling body)
22b Groove
30 Heat generating body
60c, 60c', 60c" Protrusion
C1 to C5 Vortex flow generating portion

The invention claimed is:

1. A heat-radiating system that radiates heat by heat exchange between a substrate and a cooling fluid, comprising:
a cooling structure comprising a vortex flow generating portion on a surface of the substrate that is in contact with the cooling fluid, in which the vortex flow generating portion is constituted by a plurality of recesses that extend in a direction intersecting the flow direction of the cooling fluid and cause a vortex flow depending on a flow condition of the cooling fluid,
wherein a depth H (m) of a recess of the vortex flow generating portion and a laminar sub-layer thickness $\delta_b$ (m) near a wall surface satisfy the following relation (1):

$$H > \delta_b = 63.5/(Re^{7/8}) \times d \quad (1)$$

where Re is a Reynolds number, d is a characteristic length (m), and the Reynolds number is defined as Re=ud/v where v is a kinematic viscosity (m²/s) of the cooling fluid, u is a flow velocity (m/s) of the cooling fluid and d is the characteristic length,
operation of the heat-radiating system is controlled such that the flow condition of the cooling fluid falls within a range in which the following relation (2) is satisfied:

$$u/v \leq 206 \times d^{1/7} \quad (2)$$

where u, v and d are as defined above, and
the characteristic length d=4A/L is equal to or greater than 0.004, the characteristic length being calculated from a minium channel cross-sectional area A (m²) of a channel cross-section perpendicular to the flow direction of the cooling fluid and a maxium wetted perimeter L (m).

2. The heat-radiating system according to claim 1, wherein the flow condition of the cooling fluid falls within a range in which the following formula (3) is satisfied:

$$u/v \leq 455 \times d^{1/7} \quad (3)$$

where u, v and d are as defined above.

3. The heat-radiating system according to claim 1, wherein, in a condition that requires heat radiation, the kinematic viscosity and the flow velocity are determined so that a value $W^+ = Wu_\tau/v$ fall within the range of from 25 to 300, the value $W^+$ being a nondimensionalized value of an opening width W (m) of the recess of the vortex flow generating portion and is obtained by using a shear velocity $u_\tau = (\tau_\omega/\rho)^{1/2}$ calculated from a shearing stress $\tau_\omega$ and a fluid density $\rho$ (kg/m³), an empirical formula of pipe friction coefficient $Cf = \tau_\omega/(0.5\rho u^2) = 0.73 Re^{-0.25}$ calculated from the flow velocity u, the fluid density $\rho$ and the Reynolds number Re, and the kinematic viscosity v.

4. The heat-radiating system according to claim 2, wherein, in a condition that requires heat radiation, the kinematic viscosity and the flow velocity are determined so that a value $W^+ = Wu_\tau/v$ fall within the range of from 25 to 300, the value $W^+$ being a nondimensionalized value of an opening width W of the recess of the vortex flow generating portion and is obtained by using a shear velocity $u_\tau = (\tau_\omega/\rho)^{1/2}$ calculated from a shearing stress $\tau_\omega$ and a fluid density $\rho$ (kg/m³), an empirical formula of pipe friction coefficient $Cf = \tau_\omega/(0.5\rho u^2) = 0.73 Re^{-0.25}$ calculated from the flow velocity u, the fluid density ρ and the Reynolds number Re, and the kinematic viscosity v.

5. The heat-radiating system according to claim 1, wherein a maximum depth H of the recess is small compared to a distance X from an opening plane of the recess to an opposing channel surface.

6. The heat-radiating system according to claim 2, wherein a maximum depth H of the recess is small compared to a distance X from an opening plane of the recess to an opposing channel surface.

7. The heat-radiating system according to claim 3, wherein a maximum depth H of the recess is small compared to a distance X from an opening plane of the recess to an opposing channel surface.

8. The heat-radiating system according to claim 4, wherein a maximum depth H of the recess is small compared to a distance X from an opening plane of the recess to an opposing channel surface.

\* \* \* \* \*